US006775806B2

(12) United States Patent
Li

(10) Patent No.: US 6,775,806 B2
(45) Date of Patent: Aug. 10, 2004

(54) METHOD, SYSTEM AND COMPUTER PRODUCT TO PRODUCE A COMPUTER-GENERATED INTEGRATED CIRCUIT DESIGN

(75) Inventor: Mu-Jing Li, Sunnyvale, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 100 days.

(21) Appl. No.: 10/166,210

(22) Filed: Jun. 10, 2002

(65) Prior Publication Data

US 2003/0229860 A1 Dec. 11, 2003

(51) Int. Cl.[7] .............................................. G06R 17/50
(52) U.S. Cl. ............................................... 716/1; 716/5
(58) Field of Search ....................................... 716/1–18

(56) References Cited

U.S. PATENT DOCUMENTS

| | | | |
|---|---|---|---|
| 5,550,839 A | | 8/1996 | Buch et al. |
| 5,754,826 A | * | 5/1998 | Gamal et al. ................. 703/14 |
| 5,946,218 A | | 8/1999 | Taylor et al. |
| 6,093,214 A | * | 7/2000 | Dillon ........................ 716/17 |
| 6,237,126 B1 | | 5/2001 | Bonitz |
| 6,304,790 B1 | | 10/2001 | Nakamura et al. |
| 6,374,395 B1 | | 4/2002 | Wang |
| 6,606,735 B1 | * | 8/2003 | Richardson et al. ........... 716/5 |
| 6,611,946 B1 | * | 8/2003 | Richardson et al. ........... 716/5 |
| 2003/0088843 A1 | * | 5/2003 | Mohrotra et al. ............. 716/12 |
| 2003/0135831 A1 | * | 7/2003 | Hsiao et al. .................. 716/4 |

OTHER PUBLICATIONS

Fei, jai et al. *LVS (Layout–Versus–Schematic) with Virtuoso*, Virginia Polytechnic Institute and State University, http://www.ee.vt.edu/~ha/cadtools/cadence/lvs.html. Nov. 20, 1999.

Jagasivamani, Meenatchi et al. *Layout with Virtuoso*, Virginia Polytechnic Institute and State Univeristy, http://www.ee/vt.edu/~ha/cadtools/cadence/layout.html. Feb. 27, 2000.

Jagasivamani, Meenatchi et al. *Introduction to Skill*, Virginia Polytechnic Institute and State Univeristy, http://www.ee.vt-.edu/~ha/cadtools/cadence/skill.html. Apr. 13, 2000.

Pistauer, M. et al. *Integration of Saber Simulation Results Into the Cadence Framework Database By Using the Cell Property Feature*, Siemens Designcenter for Microelectronics, Siemensstrasse 2, A–9500 Villach, Austria.

Sulistyo, Jos et al. *HSpice Netlist Extraction with Cadence*, Virginia Polytechnic Institute and State University, http://www.ee.vt.edu/~ha~cadtools/cadance/extraction.html. Oct. 21, 2002.

*Diva Verification*, http://www.cadence.com/datasheets/diva.html. 2002 Cadence Design Systems, Inc.

*CAD Design Flows Development in a Cross–Platform Computing Environment*, http://developer.intel.com/technology/itJ/q11999/articles/art_4c.html.

* cited by examiner

*Primary Examiner*—Vuthe Siek
(74) *Attorney, Agent, or Firm*—Zagorin, O'Brien & Graham LLP

(57) ABSTRACT

The present invention provides a method, a system and a computer product for designing an integrated circuit using control software and employing the control software to dynamically generate rules files in response to changes made to the design in order to verify adherence of the changes made to the integrated circuit design with design rules.

20 Claims, 6 Drawing Sheets

US 6,775,806 B2

METHOD, SYSTEM AND COMPUTER PRODUCT TO PRODUCE A COMPUTER-GENERATED INTEGRATED CIRCUIT DESIGN

BACKGROUND OF THE INVENTION

The present invention relates to integrated circuit development, and more specifically to a design environment for computer-aided integrated circuit development.

A typical development process for integrated circuits can be generally divided into a front-end design phase and a back-end development phase. During the front-end phase, the engineer user designs and develops, from a set of specifications, a logical representation of the integrated circuit of interest in the form of a schematic. With the aid of integrated circuit test tools available, an engineer may test the design of the integrated circuit. For example, the operation of the integrated circuit design may be emulated.

The back-end development involves several steps during which a final circuit layout (physical description) is developed based on the schematic. During the back-end development various building blocks (or cells) as defined by the finalized integrated circuit schematic are placed within a predefined floor plan. For integrated circuit designs based on array or standard cell technology, the various circuit building blocks are typically predefined and made available to a computer from a cell library stored remotely with respect thereto e.g., on a server. As a result, each cell may correspond to one or more electrical functions, e.g., resistor, capacitor, differential operational amplifier, J-K flip-flop and the like. Placement is followed by a routing, during which interconnects between cells are routed throughout the layout. Finally, the accuracy of the layout versus the schematic is verified, with the aid of integrated circuit test tools available to the client terminal from the server.

A well known suite of integrated circuit design and test tools is DESIGN FRAMEWORK II® (DFII) available from CADENCE®. DFII provides a common user interface and a common database for the design tools included in the suite. This avoids having to translate the database files when working with the differing tools in the suite. To that end, the data associated with a particular integrated circuit design are organized in libraries. The libraries consist of cells that are a database object that contains information concerning the basic building blocks of an integrated circuit, e.g., metal, inverter, resistor, via, etc. The libraries are associated with a Technology File that includes information concerning the design rules and electrical functions that an integrated circuit must satisfy.

Referring to FIG. 1, a typical design flow employed using DFII includes creating a schematic of the cells associated with an integrated circuit design at step 10. This may be performed employing the VIRTUOSO SCHEMATIC COMPOSER® tool included with DFII. At step 12, schematic is analyzed by a different tool associated with DFII, such as AFFIRMA SPECTRE CIRCUIT SIMULATOR®. This tool simulates the operation of the circuit and determines operational characteristics of the same. After determining that the schematic operated in accordance with the associated technology file, at step 14, the layout of the integrated circuit is performed. The integrated circuit may be laid-out using another tool associated with DFII, such as VIRTUOSO LAYOUT EDITOR®. At step 16, verification of the layout is achieved using another tool to identify violations of geometric or electrical rules, as well as to verify the function of the physical implementation.

The DIVA® verification tool provides numerous commands and modifiers to develop Design Rule Checks (DRC) that verify adherence to fabrication design rules associated with Technology Files. The DIVA® verification tool also allows recognition and extraction of device parameters from all integrated circuit technologies. To that end, predefined device descriptions are included that greatly reduce the time for extraction of the device parameters. Also, electrical-connectivity check on both logical and physical network representations may be performed using the DIVA® verification tool. Complete control over the parameters being checked is afforded, e.g., whether parameters must be matched exactly or be within a certain range.

Operation of DFII is regulated by control software, such as the SKILL® programming language. Specifically, commands and internal communication with and between the tools associated with DFII occurs through the use of SKILL®. SKILL® is available to the Engineers using DFII to create scripts for performing various tasks with the DFII. Difficulty arises, however, in fully integrating SKILL® programming language with the various tools associated with DFII so that the full power of the DFII can be realized to reduce the time required to design an integrated circuit. Specifically, to perform the verification of an integrated circuit design, SKILL® is employed to create a plurality of rules files. Each rules file includes a sequence of commands required for DIVA® to determine whether an integrated circuit design satisfies design rules. To that end, for each feature verified, every rules file must be called by DIVA® to ensure that the pertinent design rules are analyzed for the feature being verified. Alternatively, the appropriate rules files contained in a database of rules files are identified and invoked by DIVA®, manually by a design engineer. Both of these methods of verification are time-consuming and tedious.

A need exist, therefore, to provide an improved method, a system and a computer product, to generate and verify integrated circuit designs on computers while by fully integrating design tools associated with the tool suite.

SUMMARY OF THE INVENTION

The present invention provides a method, a system and a computer product for designing an integrated circuit using a computer having a memory that features dynamically generating rules files to verify adherence of an integrated circuit design with design rules. To that end, a method in accordance with one embodiment of the present invention includes mapping the integrated circuit into various addresses of the memory as multiple production layers. The multiple production layers include a plurality of data objects. The addresses in memory corresponding to the locations in one of the multiple production layers are identified where data object characteristics are to be varied. These addresses are referred to as varied object addresses. The data object characteristics stored at the varied object addresses are varied, defining varied data objects. Information concerning the varied data objects is stored in the memory addresses associated with a construction layer. This information includes the varied object addresses. A rules file is generated and loaded into the memory, at addresses different from the varied object addresses. The rules file includes a sequence of commands to analyze the data object characteristics stored at the varied object addresses to determine whether characteristics of the varied data objects satisfy design rules. The commands associated with the sequence are dependent upon the production layer with which the varied objects are associated, as well as the objects being varied. Then, varied data objects having characteristics that violate the design rules are distinguished from data objects having characteristics that satisfy the design rules. Also included are a system and a computer product that functions in accordance with the method.

DETAILED DESCRIPTION OF THE PREFERRED EMBODIMENTS

Figure 1:
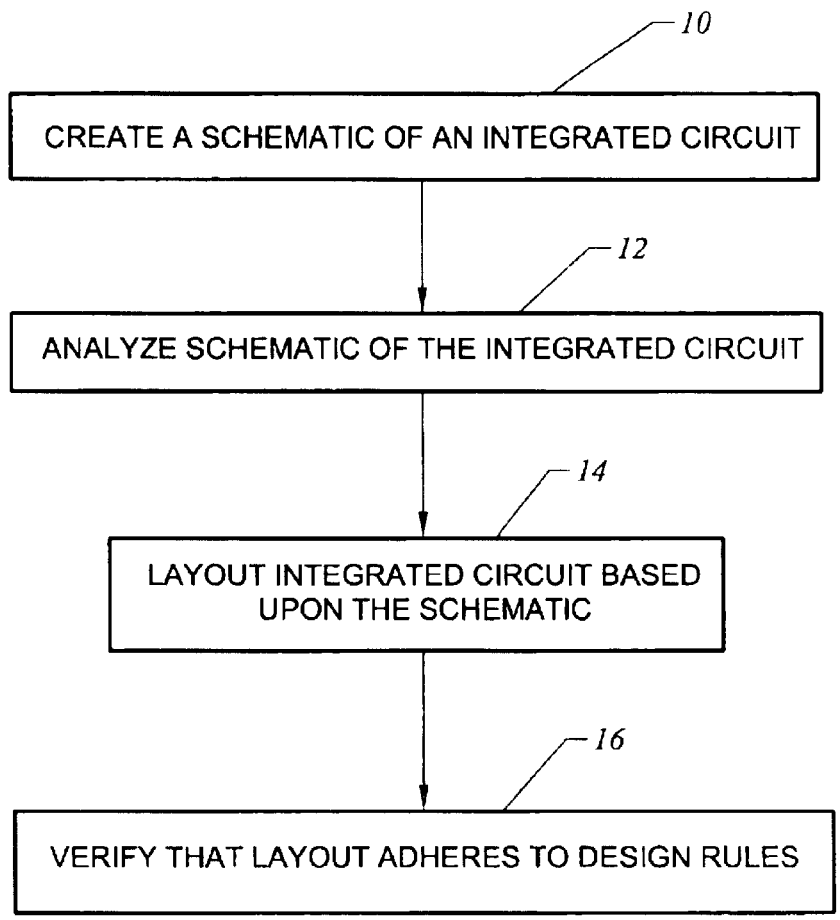
FIG. 1 is a flow diagram of a process for designing integrated circuits in accordance with the prior art.
Figure 2:
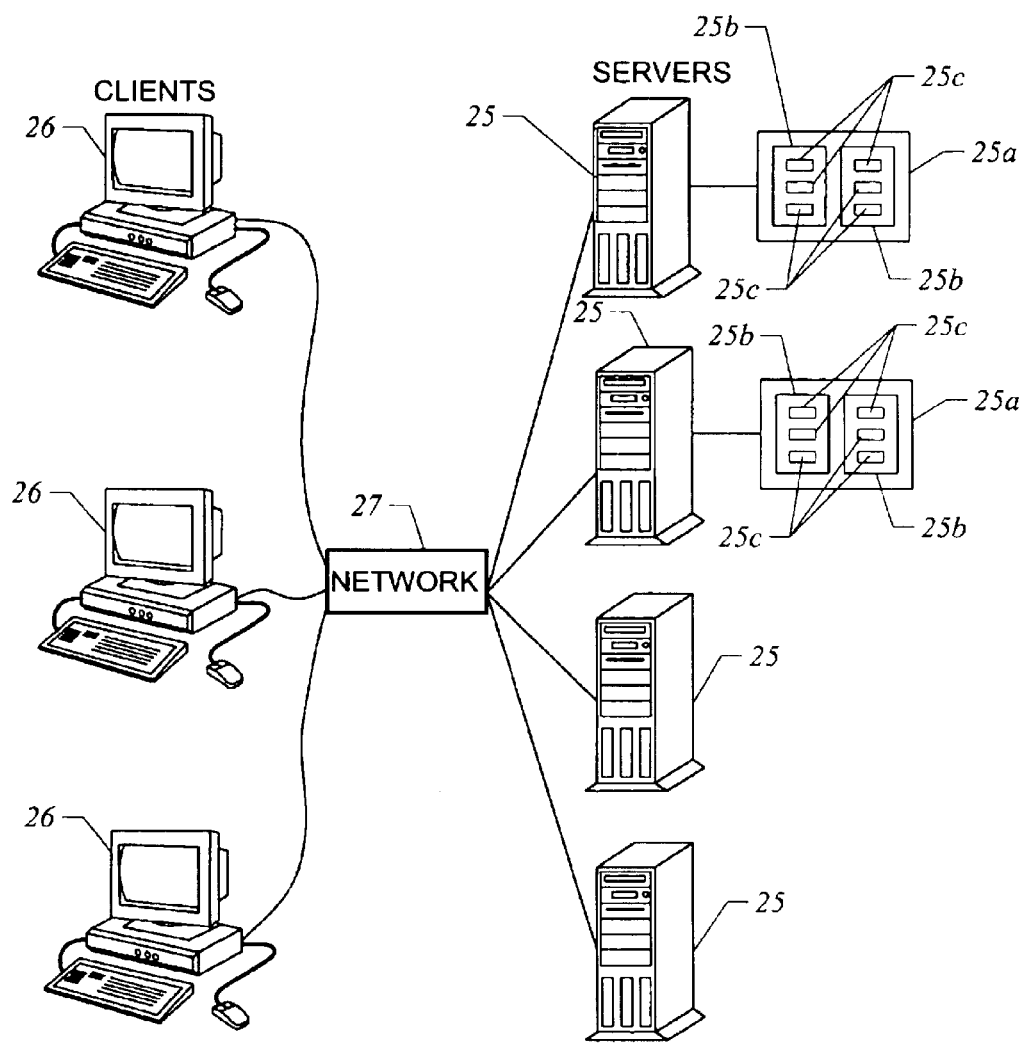
FIG. 2 is a simplified plan view of a computer network in which the present invention is implemented.

Referring to FIG. 2, shown is a plurality of servers 25 accessible by client terminals 26 over a network 27. Communication between servers 25 and client terminals 26 may be over a public network, such as a public switched telephone network over ASDL telephone lines or large bandwidth trunks, such as T1 or OC3 service. Alternatively, client terminals 26 may communicate with servers 25 over a local area network. In the present example, the invention is discussed with respect to communication over a network employing Ethernet protocols. To facilitate communication over network 27, client terminals 26 execute application specific software, to produce a Graphical User Interface (GUI), shown more clearly in FIG. 3.

Figure 3:
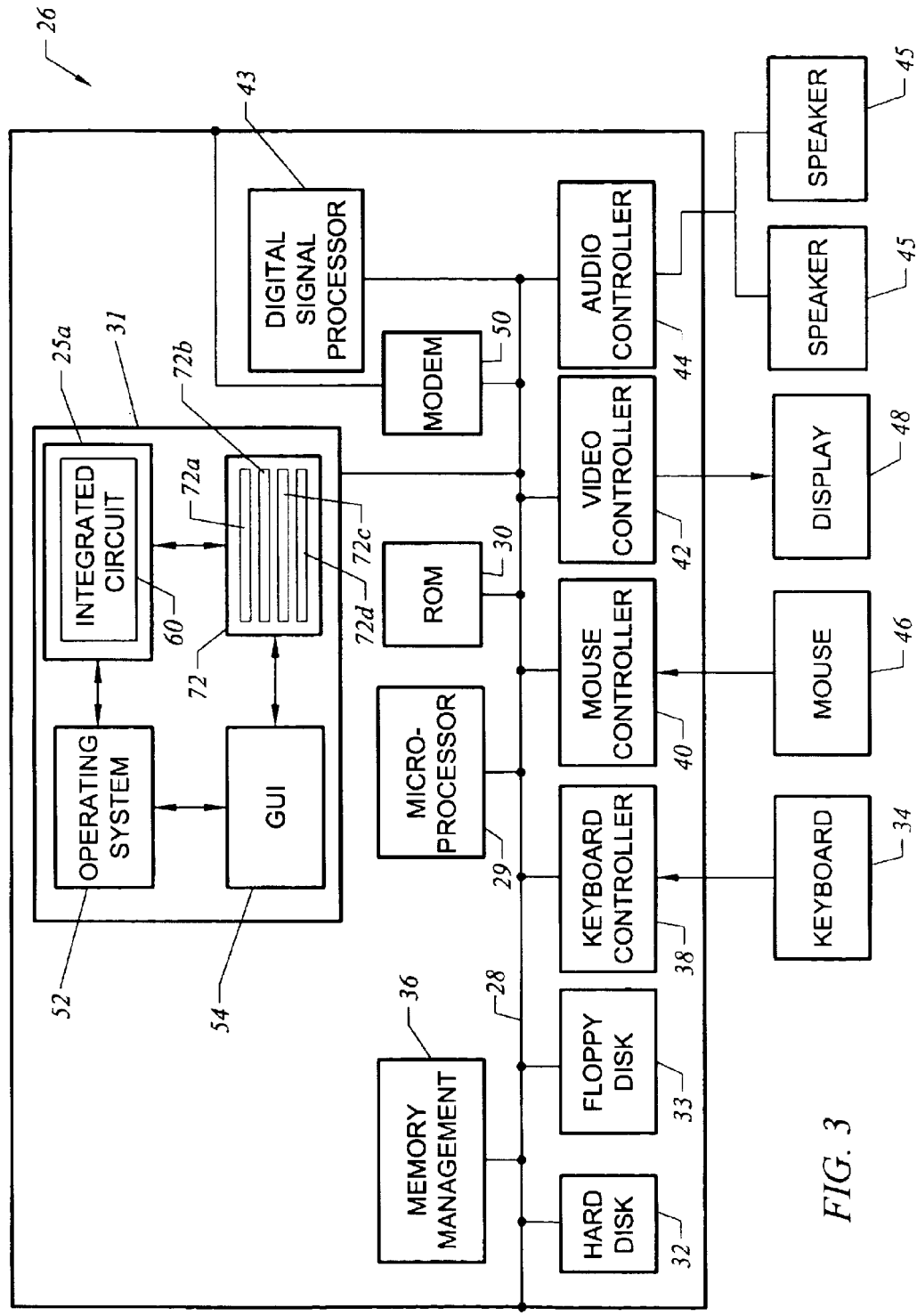
FIG. 3 is a block diagram of a client terminal shown in FIG. 2.
Figure 5:
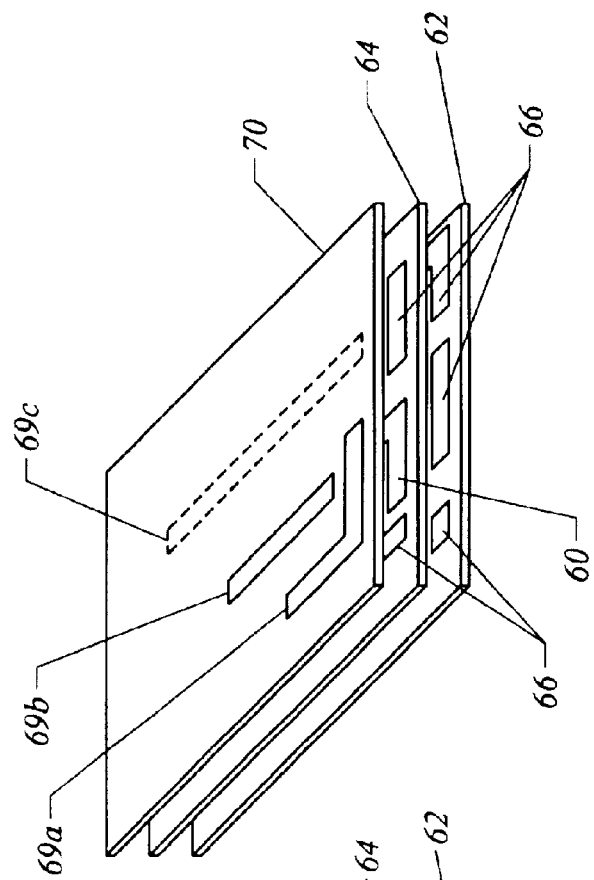
FIG. 5 is a perspective view showing an arrangement of production layers into which an integrated circuit design is mapped into a memory shown in FIG. 3, along with a marker layer.
Figure 4:
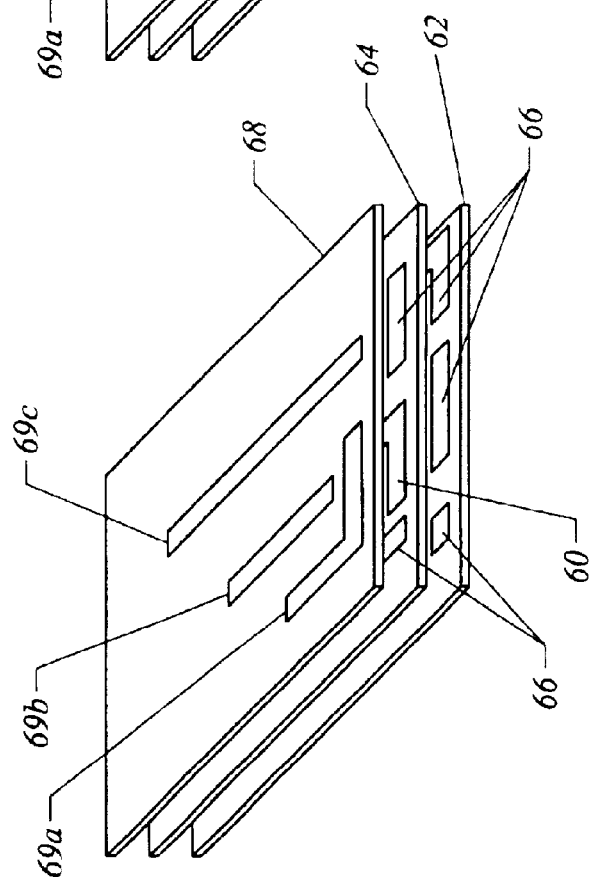
FIG. 4 is a perspective view showing an arrangement of layers into which an integrated circuit design is mapped into a memory shown in FIG. 3, along with a construction layer.

Referring to FIG. 3, each of the client terminals 26 includes one or more system buses 28 placing various components thereof in data communication. For example, a microprocessor 29 is placed in data communication with both a read only memory (ROM) 30 and random access memory (RAM) 31 via system bus 28. ROM 30 contains among other code, the Basic Input-Output system (BIOS) that controls basic hardware operation such as the interaction with peripheral components such as disk drives 32 and 33, as well as the keyboard 34.

RAM 31 is the main memory into which the operating system and application programs are loaded and affords at least 32 megabytes of memory space. A memory management chip 36 is in data communication with system bus 28 to control direct memory access (DMA) operations. DMA operations include passing data between the RAM 31 and the hard disk drive 32 and the floppy disk drive 33.

Also in data communication with system bus 28 are various I/O controllers: a keyboard controller 38, a mouse controller 40, a video controller 42, and an audio controller 44, which may be connected to one or more speakers 45. Keyboard controller 38 provides a hardware interface for keyboard 34, and mouse controller 40 provides a hardware interface for a mouse 46, or other point and click device. Video controller 42 provides a hardware interface for a display 48. A Network Interface Card (NIC) 50 enables data communication over the network facilitating data transmission speeds up to 1000 megabytes per second. The operating system 52 of the client terminal 26 may be UNIX, LINUX, DOS, WINDOWS-based or any known operating system.

Referring to FIGS. 2 and 3, GUI 54 is loaded in RAM 31 to facilitate integrated circuit development over network 27 by allowing access to one or more technology files 25a stored on one or more servers 25. For purposes of the present invention, GUI 54 facilitates communication with a suite of tools available from CADENCE® under the tradename DESIGN FRAMEWORK II®. As a result, included in technology files 25a are libraries 25b, each of which includes a plurality of cells having multiple views represented by data objects 25c. Data objects 25c, as discussed above, contain information concerning the basic building blocks of an integrated circuit, e.g., metal, inverter, resistor, via, etc.

Referring to FIGS. 2, 3, 4 and 5, to commence layout of an integrated circuit 60, a layout cell view is loaded into memory 31 from one of libraries 25a, mapping integrated circuit 60 into locations of memory 31 as multiple production layers 62 and 64. Multiple production layers 62 and 64 include a plurality of data objects 66. Objects in each of production layers 62 and 64 must satisfy a particular set of design rules, rules that dictate certain parameters that the objects must satisfy. For example, objects 66 on layer 62 may correspond to a first metal construct that must satisfy certain geometric and electrical constraints. Objects 66 on layer 64 may correspond to a second metal construct that must satisfy geometric and electrical constraints that differ from those applicable to the metal one construct. As a result the metal one construct and the metal two construct are associated with differing layers of integrated circuit 60.

When varying object data, say in this example, on metal two production layer 64, control software, such as SKILL®, may employ a layout tool, e.g., the VIRTUOSO LAYOUT EDITOR®. For example, assuming data objects 69a, 69b and 69c, are to be laid-out on production layer 64, characteristic data concerning data objects 69a, 69b and 69c would be stored in memory addresses referred to as varied object addresses. Information concerning the data objects 69a, 69b and 69c would be with a construction layer 68 that is stored in other addresses in memory 31. The information includes the varied object addresses. To verify that the data characteristics satisfy design rules, the control software directs a verification routine, such as those associated with the DIVA® verification tool, to search memory 31 for construction layer 68. The verification tool operates on construction layer 68 and searches the varied object addresses in memory 31 to determine whether objects 69a, 69b and 69c satisfy the design rules. Assuming, for example, that two of objects, e.g., 69a and 69b, fail to satisfy the design rules, then information concerning objects 69a and 69b would be stored in addresses of memory 31 associated with a marker layer 70. Object 69c is stored in memory locations associated with production layer 64 and is shown in dashed lines, to that end.

Thereafter, the control software directs the layout tool to search memory 31 for marker layer 70 and apply a correction routine to modify a subset of the characteristics of objects 69a and 69b stored at the varied object addresses to correct design rule violations. After implementation of the correction routine, information concerning objects 69a and 69b would once again be stored in memory 31 as a construction layer 68. Control software directs verification tool to operate on construction layer 68 and search memory 31 to analyze the characteristic data at the varied object addresses to determine whether objects 69*a* and 69*b* satisfy the design rules. Control software could direct the layout tool and the verification tool to continuously repeat these steps, as needed, in order to exhaust all available correction routines to increase the probability that data objects 69*a* and 69*b* satisfy the design rules.

To undertake the aforementioned verification process, the control software directs the verification tool to carry-out a sequence of operations contained in a rules file 72. Rules file 72 is generated by control software, in response to generation of construction layer 68. Verification tool undertakes verification of objects 69*a* and 69*b* in construction layer 68 in accordance with the sequence of commands 72*a*, 72*b*, 72*c* and 72*d* in rules file 72. The sequence of commands 72*a*, 72*b*, 72*c* and 72*d* includes commands that are required to verify the design rules associated with production layer 64. To that end, commands associated with the sequence are defined by and dependent upon, the location of production layer 64 among the plurality of production layers 62 and 64, as well as the characteristics associated with the subset. In this manner, the sequence of commands 72*a*, 72*b*, 72*c* and 72*d* contained in rules file 72 will differ depending upon the production layer with which data objects are associated, and the characteristics being varied. The advantage of this design technique is that it allows dynamically generating and dispensing of rules files in the same memory that the data objects being varied are resident. This automates the design flow of an integrated circuit, thereby free-up engineering resources to participate in other tasks.

Figure 6:
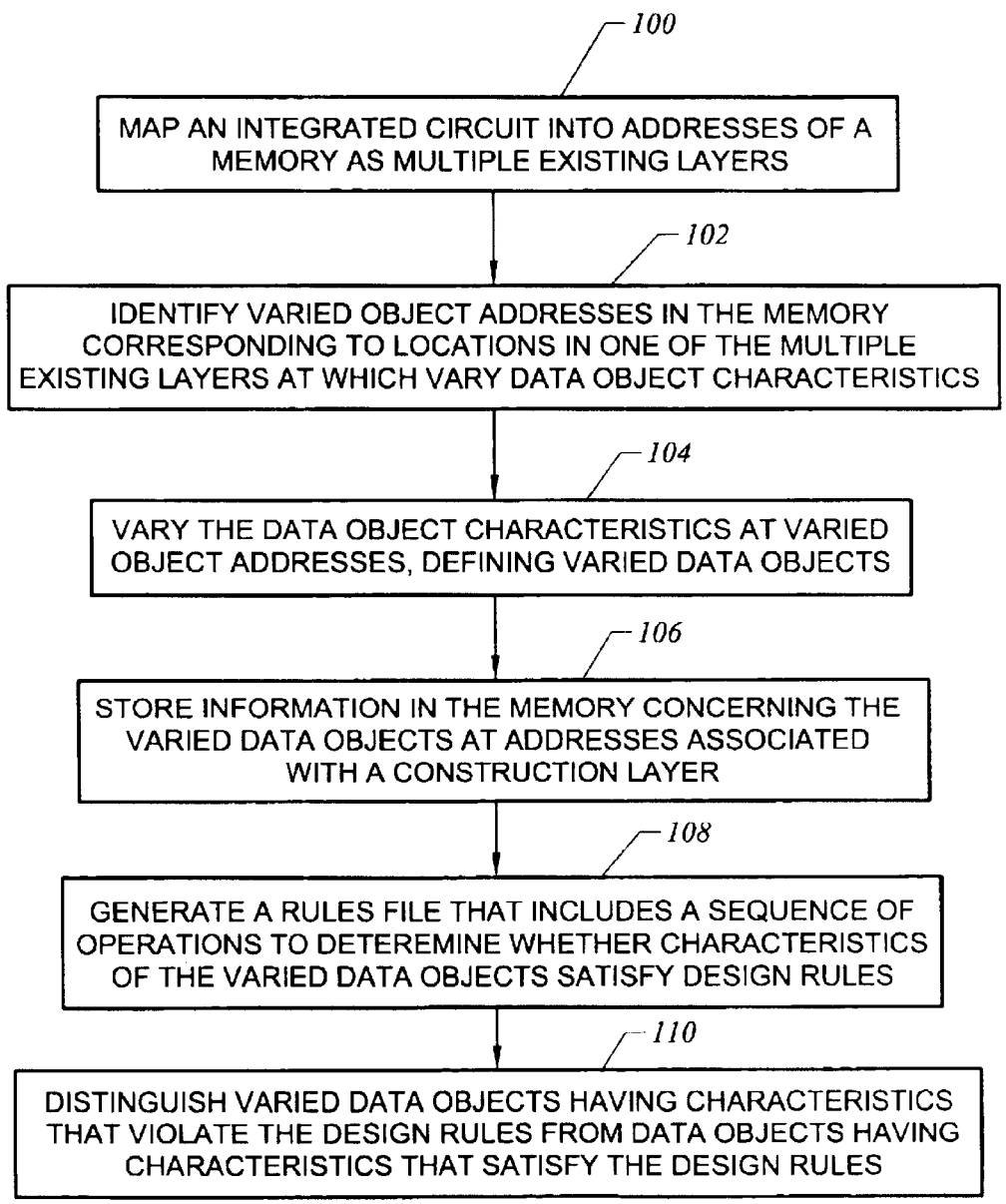
FIG. 6 is a flow diagram of a process for designing integrated circuits in accordance with one embodiment of the present invention.

Referring to FIGS. 3 and 6, one method in accordance with the present invention includes mapping the integrated circuit into addresses of memory 31 as multiple production layers at step 100. At step 102, addresses in memory 31 corresponding to the locations in one of the multiple production layers are identified where data object characteristics are to be varied. These addresses are referred to as varied object addresses. At step 104, the data object characteristics at the varied object addresses are varied. Varying the object characteristics may include placing a data object at one or more of the locations that did not previously have a data object or removing a previously placed data object from the locations. In addition, this may also include modifying characteristics of an existing data object, for example, a data object that did not satisfy the design rules and was being modified to increase the probability that the same would satisfy the design rules. The characteristics that may be modified may be any associated with the data object including, but not limited to, object shape, dimensions, coordinates within the construction layer, or the layer with which the object is associated, as well as special properties. At step 106, information concerning the varied data objects is stored in memory 31 at addresses associated with a construction layer 68. This information includes the varied object addresses. A rules file is generated at step 108. The rules file is an interpreted program that includes a sequence of commands that a command interpreter of a verification tool, such as DIVA®, uses to determine whether the modified data objects at the aforementioned memory locations satisfy the design rules. To that end the sequence of commands results in analysis of data object characteristics stored at the varied object addresses to determine whether characteristics of the varied data objects satisfy the design rules. The commands associated with the sequence are dependent upon the production layer with which the varied objects are associated, as well as the characteristics of the data objects that are changed. For example, were entirely new data object placed at the location in the production layer, then commands would be included in the rules file so that all characteristics associated with the data object are analyzed. Were a subset of characteristics of existing data object modified, for example, shape, then the sequence would include only those commands required to analyze the characteristics that affect the nature of the shape modification. At step 110, the varied data objects having characteristics that violate the design rules are distinguished from data objects having characteristics that satisfy the design rules.

Figure 7:
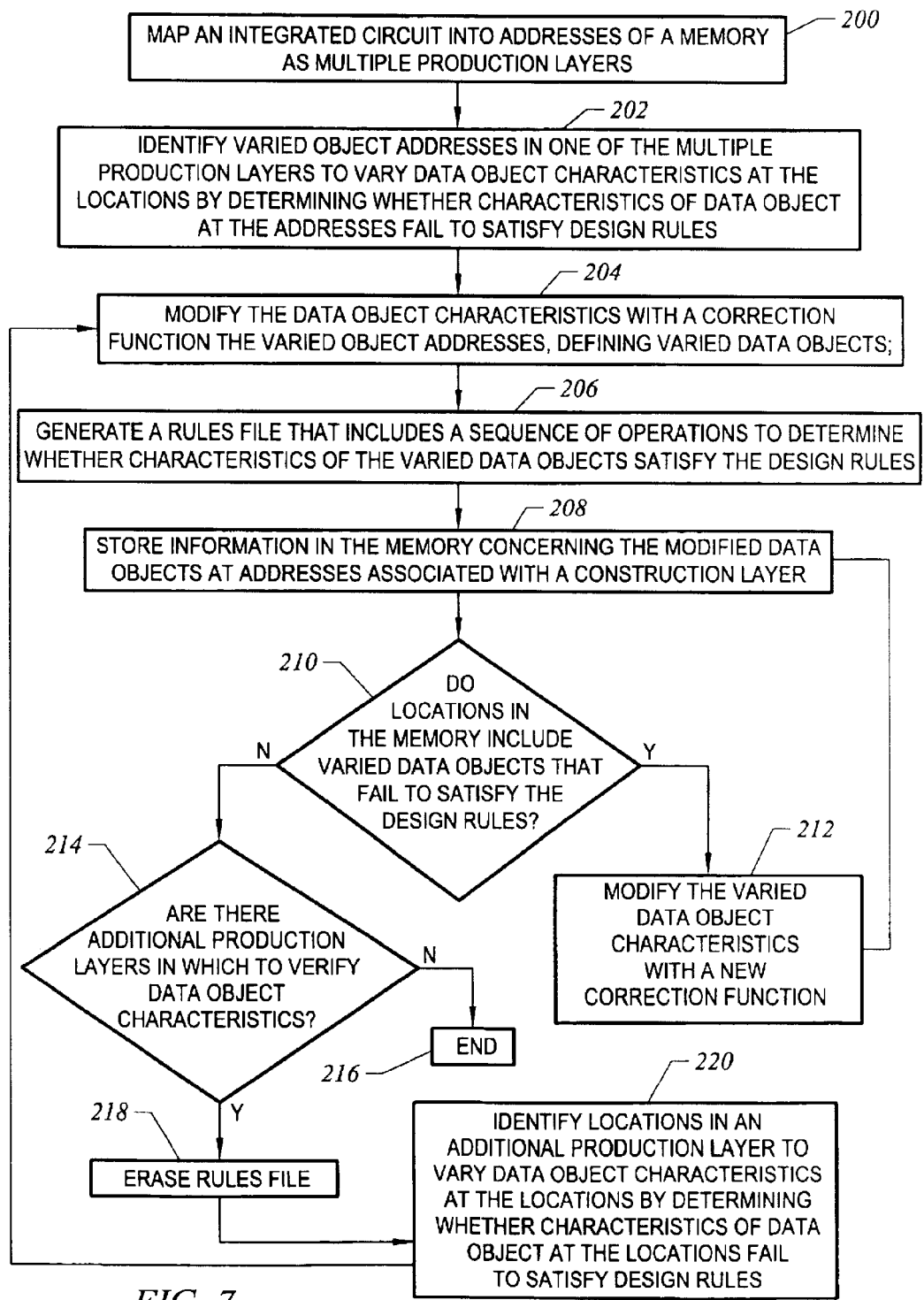
FIG. 7 is a flow diagram of a process for designing integrated circuits in accordance with a second embodiment of the present invention.

Referring to FIGS. 3 and 7, another embodiment of the present invention is discussed with respect to correction of data objects that fail to satisfy design rules. To that end, at step 200, an integrated circuit is mapped into locations of memory 31 as multiple production layers. At step 202, addresses in memory 31 corresponding to the locations in one of the multiple production layers are identified where data object characteristics are to be modified, i.e., the modified object addresses are identified. This is achieved by identifying data objects having characteristics that fail to satisfy the design rules. At step 204, the control software operates to have a layout tool modify the data object characteristics stored at the varied object addresses with a correction function to produce modified data objects.

To facilitate determining whether the data object characteristics satisfy design rules associated with this layer, a rules file is generated, at step 206, by the control software. The rules file is an interpreted program that includes a sequence of commands that a command interpreter of a verification tool, such as DIVA®, uses to determine whether the modified data objects at the aforementioned memory locations satisfy the design rules. At step 208, information concerning the modified data objects is stored in memory 31 at addresses associated with construction layer 68.

At step 210, the verification tool follows the commands in the rules file to search memory 31 for construction layer 68. The verification tool operates on construction layer 68 and searches the varied object addresses in memory 31 to determine whether the varied objects fail to satisfy the design rules. Were this the case, then the objects would be associated with addresses in memory 31 that correspond to a marker layer. At step 212, the control software searches memory 31 for the marker layer and operates on the marker layer to search memory 31 for the varied object addresses to modify the data object characteristics stored there with a new correction function. Thereafter, steps 208 and 210 would be repeated.

Were it found that all data objects in the layer had characteristics that satisfied the design rules, then step 214 would occur. At step 214, it is determined whether there are additional production layers in which to determine whether data object characteristics satisfies the design rules. Were this not the case, the procedure would end at step 216. Otherwise the procedure continues to step 218 wherein the previous rules file is erased. Thereafter, at step 220, locations in the additional production layer are identified in which data object characteristics are to be modified in the same manner as discussed with respect to step 202. Thereafter, the procedure returns to step 204 and continues therefrom.

It can be seen that the rules file is dynamically generated and invoked multiple times without having to verify the data objects each time a modification of the same has taken place. In this manner, the rules file does not need to be regenerated until all modification techniques that may be made to the data objects to ensure the same satisfy the design rules have been exhausted. In addition, once the procedure continues to modify data objects associated with a new production layer, the rules file is dynamically erased and regenerated to include a sequence of operations specific to the new production layer and/or the characteristics of the data objects that are modified. The dynamic generation and erasure of the rules file facilitates integrated circuit design without interruption and translation of data to other formats, thereby automating the design process.

Although the foregoing has been discussed with respect to the DFII suite for integrated circuit design, it should be understood that the present invention may be employed in any type of computer aided design suite or tool. Thus, the embodiments of the present invention described above are exemplary and the scope of the invention should, therefore, be determined not with reference to the above description, but instead should be determined with reference to the appended claims along with their full scope of equivalents.

What is claimed is:

1. A method for designing an integrated circuit using a computer having a memory, said method comprising:
   mapping said integrated circuit into locations of said memory as multiple production layers with said multiple production layers including a plurality of data objects;
   identifying locations in one of said multiple production layers at which to vary data object characteristics;
   varying said characteristics at said locations to form varied data objects;
   storing information in said memory concerning said varied data objects as a construction layer;
   generating a rules file, in response to varying said characteristics, with said rules file including a sequence of commands to determine whether said varied data objects satisfy design rules, with the commands associated with said sequence being dependent upon the production layer, among said multiple production layers with which said varied objects are associated and the characteristics that are varied; and
   distinguishing said varied data objects that violate said design rules from data objects satisfying said design rules.

2. The method as recited in claim 1 wherein said operations associated with said sequence are instructions included in CADENCE® DESIGN FRAMEWORK II®.

3. The method as recited in claim 1 wherein identifying locations in one of said multiple layers further includes identifying among said plurality of data objects, data objects having characteristics that violate said design rules, defining failed data objects, and storing data concerning said failed data objects at memory addresses in said memory associated with a marker layer, with said data including addresses in said memory of said failed data objects.

4. The method as recited in claim 1 wherein distinguishing said varied data objects further includes identifying said varied data objects having characteristics that satisfy said design rules, defining acceptable data objects, and staring data concerning said acceptable data objects at addresses in said memory associated with said one of said multiple production layers.

5. The method as recited in claim 1 wherein varying said characteristics further includes placing a data object at said locations.

6. The method as recited in claim 1 wherein varying said characteristics further includes removing a data object at said locations.

7. The method as recited in claim 1 wherein varying said characteristics further includes modifying a data object at said locations.

8. The method as recited in claim 1 wherein distinguishing said varied data objects further includes storing data concerning said varied data objects having characteristics that violate said design rules in addresses of said memory associated with a marker layer, with said data objects having characteristics that violate said design rules defining object violations.

9. The method as recited in claim 8 further including removing said object violations by identifying memory addresses associated with said object violations and applying a correction function thereto, creating corrected objects and storing a cue concerning said corrected objects in said construction layer, with said cue including said memory addresses associated with said object violations.

10. A method for designing an integrated circuit using a computer having a memory, said method comprising:
    mapping said integrated circuit into locations of said memory as multiple production layers with said multiple production layers including a plurality of data objects;
    identifying locations in one of said multiple production layers at which to vary data objects at said locations, said data objects having multiple characteristics associated therewith;
    varying said data object by changing a subset of said multiple characteristics at said locations, defining varied data objects;
    storing information concerning said varied data objects in addresses of said memory associated with a construction layer;
    generating a rules file that includes a sequence of commands to determine whether characteristics of said varied data objects satisfy design rules, with the commands associated with said sequence being dependent upon the production layer, among said multiple production layers with which said varied objects are associated and the characteristics of said subset, with said instructions being associated with said sequence are instructions included in CADENCE® DESIGN FRAMEWORK II®;
    distinguishing said varied data objects having characteristics that violate said design rules from data objects having characteristics that satisfy said design rules and storing said varied data objects having characteristics that violate said design rules in addresses of said memory associated with a marker layer, with said data objects having characteristics that violate said design rules defining object violations; and
    removing said object violations by identifying memory addresses associated with said object violations and applying a correction function thereto, creating corrected objects and storing information concerning said corrected objects in addresses of said memory associated with said construction layer.

11. The method as recited in claim 10 wherein distinguishing said varied data objects further includes identifying varied data objects having characteristics that satisfy said design rules, defining acceptable data objects, and storing said acceptable data objects in addresses of said memory associated with said one production layer.

12. The method as recited in claim 10 wherein varying said data object further includes placing a data object at said locations with a different data object.

13. The method as recited in claim 10 wherein varying said characteristics further includes removing said data object at said locations.

14. The method as recited in claim 10 wherein varying said characteristics further includes modifying said data object at said locations.

15. A computer system to design an integrated circuit, said system comprising:

a processor;

a memory in data communication with said processor, a display in data communication with said processor and said memory, with said memory including a computer-readable medium having a computer-readable program embodied therein, said computer-readable program including a first set of instructions to map said integrated circuit into locations of said memory as multiple production layers with said multiple production layers including a plurality of data objects, a second set of instructions to identify locations in one of said multiple production layers at which to vary data object characteristics at said locations, a third set of instructions to vary said characteristics at said locations, defining varied data objects, a fourth set of instructions to store information concerning said varied data objects in addresses of said memory associated with a construction layer, a fifth set of instructions to generate a rules file that includes a sequence of commands to determine whether characteristics of said varied data objects satisfy design rules, with the commands associated with said sequence being dependent upon the production layer, among said multiple production layers with which said varied data objects are associated and the characteristics varied, and a sixth set of instructions to distinguish said varied data objects having characteristics that violate said design rules from data objects having characteristics that satisfy said design rules.

16. The system as recited in claim 15 wherein said sixth set of instructions further includes a subroutine to identify varied data objects having characteristics that violate, defining failed objects, and storing data concerning said failed data objects at memory addresses in said memory associated with a marker layer, with said data including addresses in said memory where said failed data objects are stored.

17. The system as recited in claim 15 wherein said sixth set of instructions further includes a subroutine to identify varied data objects having characteristics that satisfy said design rules, defining acceptable data objects, and storing said acceptable data objects in addresses of said memory associated with a production layer.

18. A computer product having a computer-readable medium that contains a program to design an integrated circuit on a computer having a memory, said computer product comprising:

computer code to map said integrated circuit into locations of said memory as multiple production layers with said multiple production layers including a plurality of data objects;

computer code to identify locations in one of said multiple production layers at which to vary data object characteristics;

computer code to vary said data object characteristics at said locations, defining varied data objects;

computer code to store information in said memory concerning said varied data objects at addresses in said memory associated with a construction layer;

computer code to generate a rules file that includes a sequence of commands to determine whether characteristics of said varied data objects satisfy design rules, with the commands associated with said sequence being dependent upon the production layer, among said multiple production layers with which said varied objects are associated and characteristics that are varied; and computer code to distinguish said varied data objects having characteristics that violate said design rules from data objects having characteristics that satisfy said design rules.

19. The computer product as recited in claim 18 wherein said code to distinguish said varied data objects further includes code to identify varied data objects having characteristics that violate said design rules, defining failed data objects, and storing data concerning said failed data objects at addresses in said memory associated with a marker layer, with said data including addresses in said memory where said varied data objects are stored.

20. The computer product as recited in claim 18 wherein said code to distinguish said varied data objects further includes code to identify varied data objects having characteristics that satisfy said design rules, defining acceptable data objects, end code to store said acceptable data objects in addresses of said memory associated with a production layer.

* * * * *

UNITED STATES PATENT AND TRADEMARK OFFICE
CERTIFICATE OF CORRECTION

PATENT NO. : 6,775,806 B2
DATED : August 10, 2004
INVENTOR(S) : Mu-Jing Li

It is certified that error appears in the above-identified patent and that said Letters Patent is hereby corrected as shown below:

Column 7,
Line 57, the word "staring" should read -- storing --.

Column 10,
Line 43, the word "end" should read -- and --.

Signed and Sealed this

Eighth Day of February, 2005

JON W. DUDAS
*Director of the United States Patent and Trademark Office*